US007883922B2

(12) United States Patent
Han

(10) Patent No.: US 7,883,922 B2
(45) Date of Patent: Feb. 8, 2011

(54) IMAGE SENSOR AND METHOD FOR MANUFACTURING THE SAME

(75) Inventor: Chang-Hun Han, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 351 days.

(21) Appl. No.: 12/046,134

(22) Filed: Mar. 11, 2008

(65) Prior Publication Data

US 2008/0224189 A1    Sep. 18, 2008

(30) Foreign Application Priority Data

Mar. 14, 2007    (KR) .................. 10-2007-0024905

(51) Int. Cl.
 *H01L 21/00*    (2006.01)
(52) U.S. Cl. .................. 438/59; 257/292; 257/E27.133
(58) Field of Classification Search .......... 257/E27.131, 257/292, E27.133; 438/59
See application file for complete search history.

(56) References Cited

U.S. PATENT DOCUMENTS

| | | | |
|---|---|---|---|
| 6,344,877 B1 * | 2/2002 | Gowda et al. | 348/245 |
| 6,633,334 B1 * | 10/2003 | Sakurai et al. | 348/308 |
| 6,657,665 B1 | 12/2003 | Guidash | |
| 7,652,314 B2 * | 1/2010 | Park | 257/292 |
| 2004/0164331 A1 * | 8/2004 | Hung | 257/292 |
| 2007/0091190 A1 * | 4/2007 | Iwabuchi et al. | 348/294 |

FOREIGN PATENT DOCUMENTS

JP    2000-232216    8/2000

OTHER PUBLICATIONS

S. Wolf, "Silicon Processing for the VLSI Era," vol. 2, Lattice Press, 1990, pp. 160-162.*

* cited by examiner

*Primary Examiner*—Chuong A Luu
*Assistant Examiner*—Nga Doan
(74) *Attorney, Agent, or Firm*—Sherr & Vaughn, PLLC

(57) ABSTRACT

An image sensor and a method for manufacturing an image sensor that has an increased aspect ratio. An image sensor and a method for manufacturing an image sensor that have a relatively large process margin (e.g. even in high level pixels), which may reduce and/or eliminate restrictions in downscaling an image sensor. An image sensor may include at least one of a first unit pixel including a first transfer transistor, a second unit pixel including a second drive transistor, and a contact electrically connecting a floating diffusion region of the first unit pixel with the second drive transistor of the second unit pixel. A method of manufacturing an image sensor including at least one of forming a first unit pixel including a first transfer transistor, forming a second unit pixel including a second drive transistor, and forming a contact electrically connecting a floating diffusion region of the first unit pixel with the second drive transistor of the second unit pixel.

10 Claims, 5 Drawing Sheets

IMAGE SENSOR AND METHOD FOR MANUFACTURING THE SAME

The present application claims the benefit under 35 U.S.C. §119 of Korean Patent Application No. 10-2007-0024905, filed Mar. 14, 2007, which is hereby incorporated by reference in its entirety.

BACKGROUND

Image sensors are semiconductor devices which may convert an optical image into an electrical signal. Examples of types of image sensors are charge coupled device (CCD) image sensor and a complementary metal oxide semiconductor (CMOS) image sensor (CIS). A CIS image sensor may include a photodiode and a metal oxide semiconductor (MOS) transistor in each unit pixel. A CIS image sensor may sequentially detects electrical signals of respective unit pixels in a switching mode to realize an image. A CIS image sensor may include a photodiode region that receives an optical signal and converts the optical signal into an electrical signal. A CIS image sensor may include a transistor region that processes the electrical signal. A CIS image sensor may have a metal line connecting a floating region of a unit pixel with a drive transistor of the unit pixel. However, the metal line may cross a photodiode region of the unit pixel, which may decrease an aspect ratio of the image sensor. A decrease in the aspect ratio may be a limitation in downscaling of image sensor chip size, thus creating complications in design and manufacturing.

SUMMARY

Embodiments relate to an image sensor and a method for manufacturing an image sensor that has an increased aspect ratio. Embodiments relate to an image sensor and a method for manufacturing an image sensor that have a relatively large process margin (e.g. even in high level pixels), which may reduce and/or eliminate restrictions in downscaling an image sensor.

In embodiments, an image sensor may include at least one of: A first unit pixel including a first transfer transistor. A second unit pixel including a second drive transistor. A contact electrically connecting a floating diffusion region of the first unit pixel with the second drive transistor of the second unit pixel.

Embodiments relate to a method of manufacturing an image sensor including at least one of: Forming a first unit pixel including a first transfer transistor. Forming a second unit pixel including a second drive transistor. Forming a contact electrically connecting a floating diffusion region of the first unit pixel with the second drive transistor of the second unit pixel.

DRAWINGS

Figure 1:
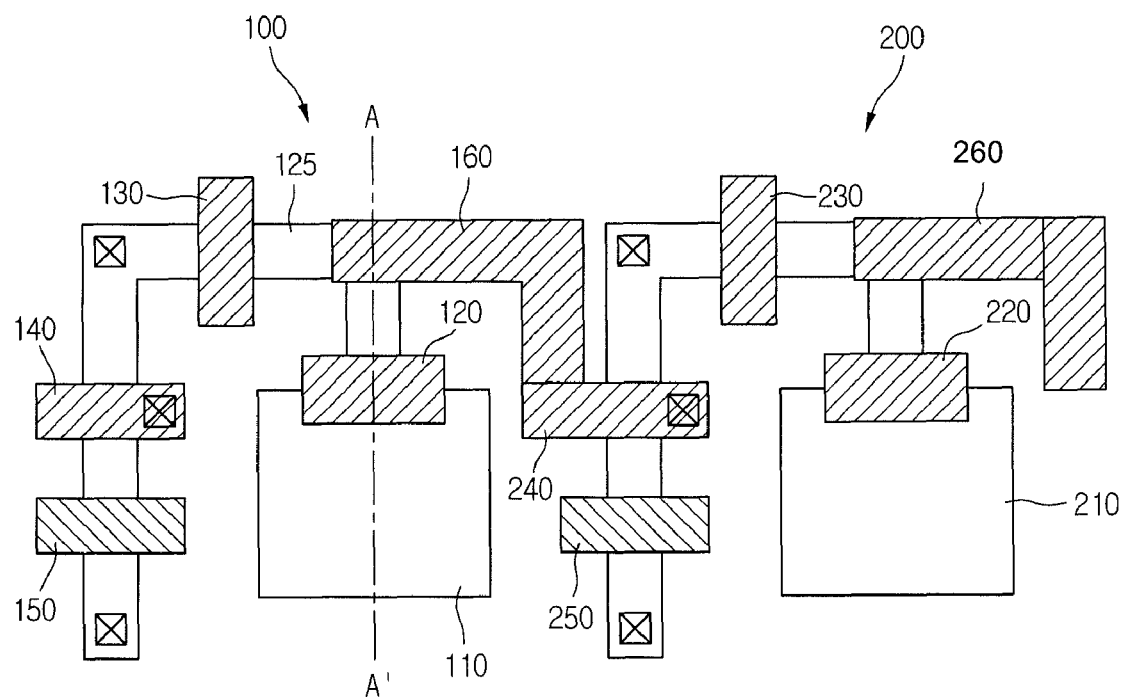

Example FIG. 1 illustrates an image sensor, in accordance with embodiments.

Figure 2A:
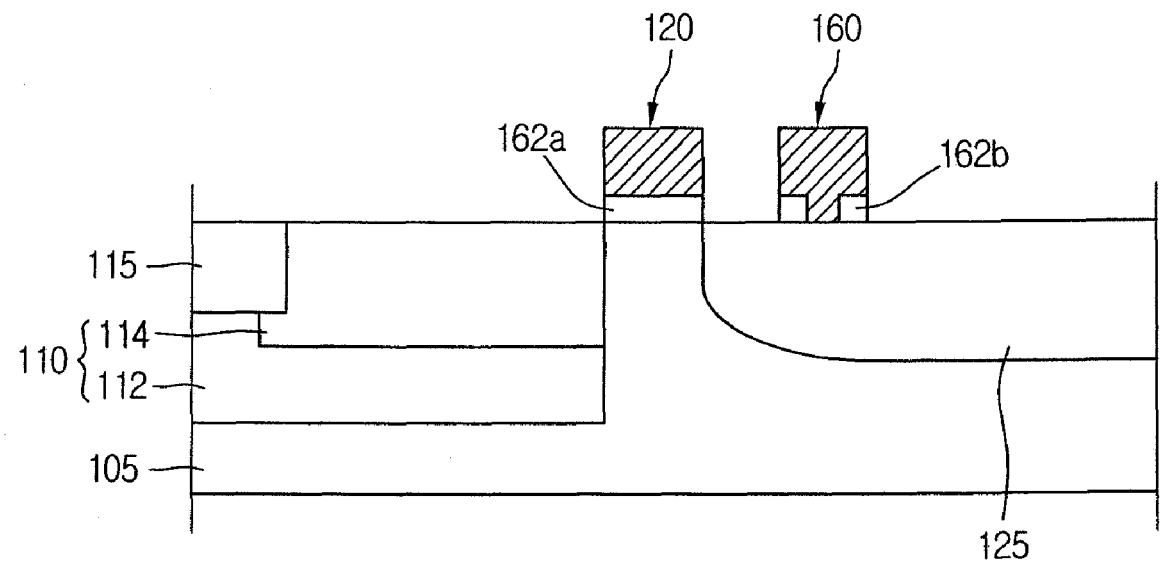

Example FIG. 2A illustrates a cross-sectional view of an image sensor according to embodiments.

Figure 2B:
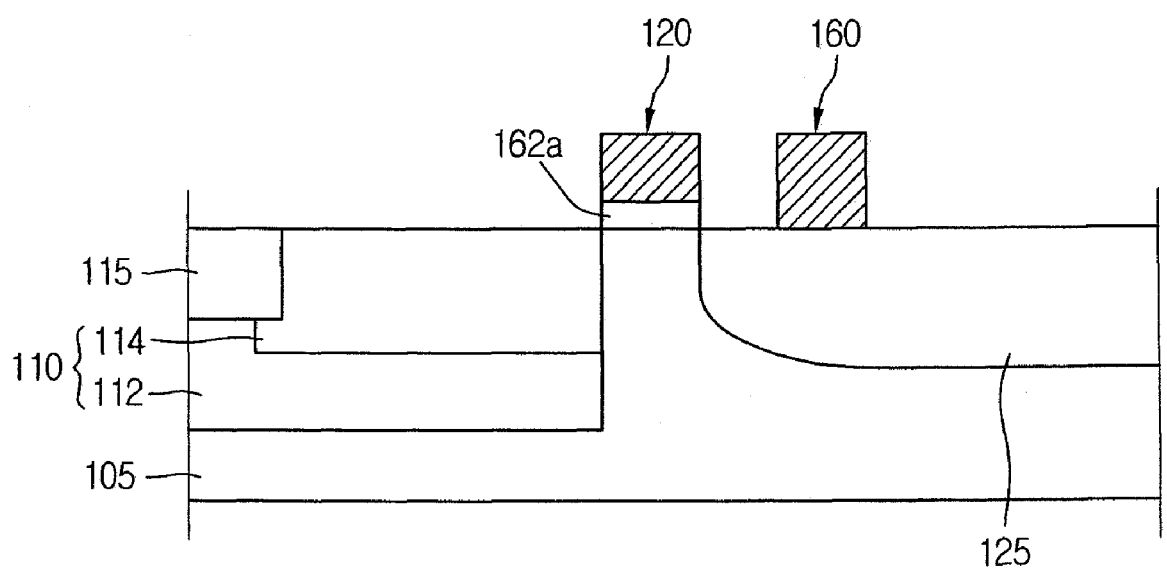

Example FIG. 2B illustrates a cross-sectional view of an image sensor according to embodiments.

Figure 3A:
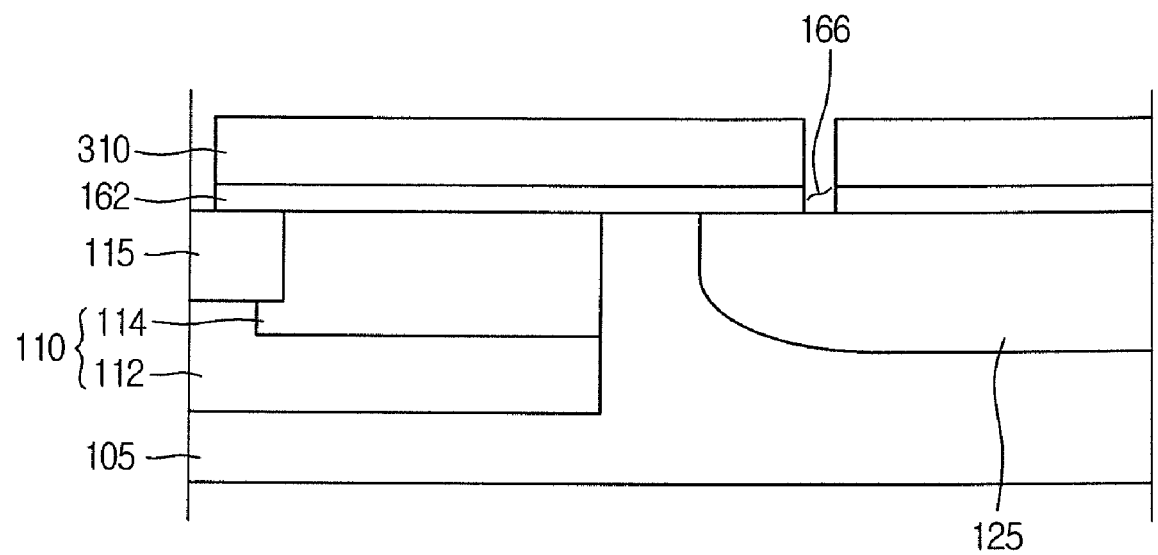
Figure 3B:
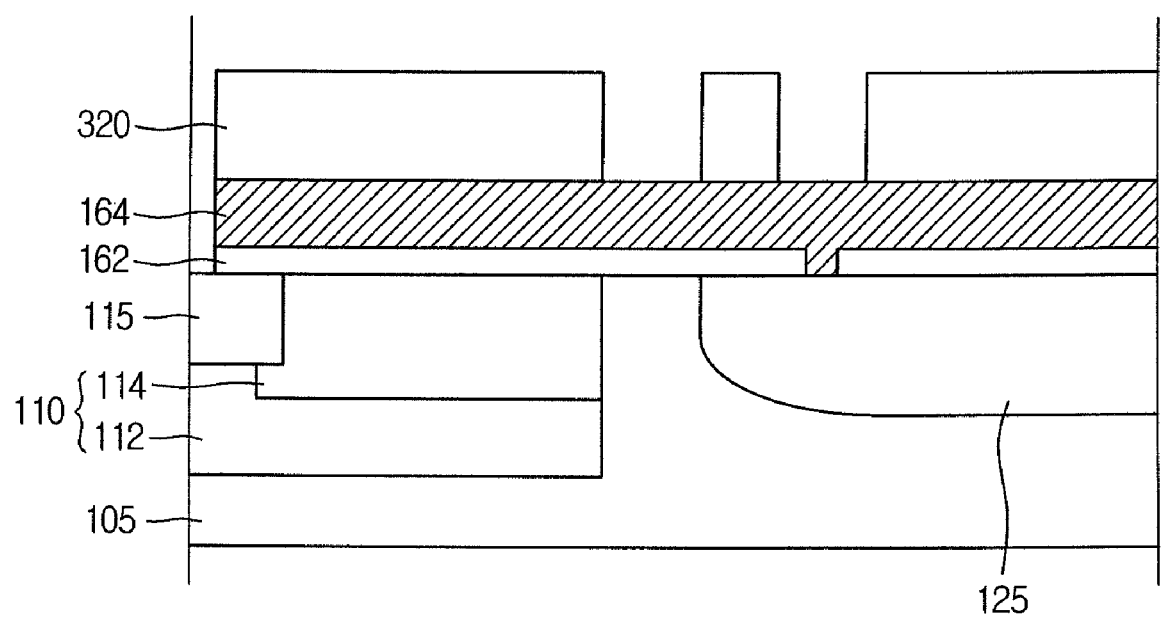
Figure 3C:
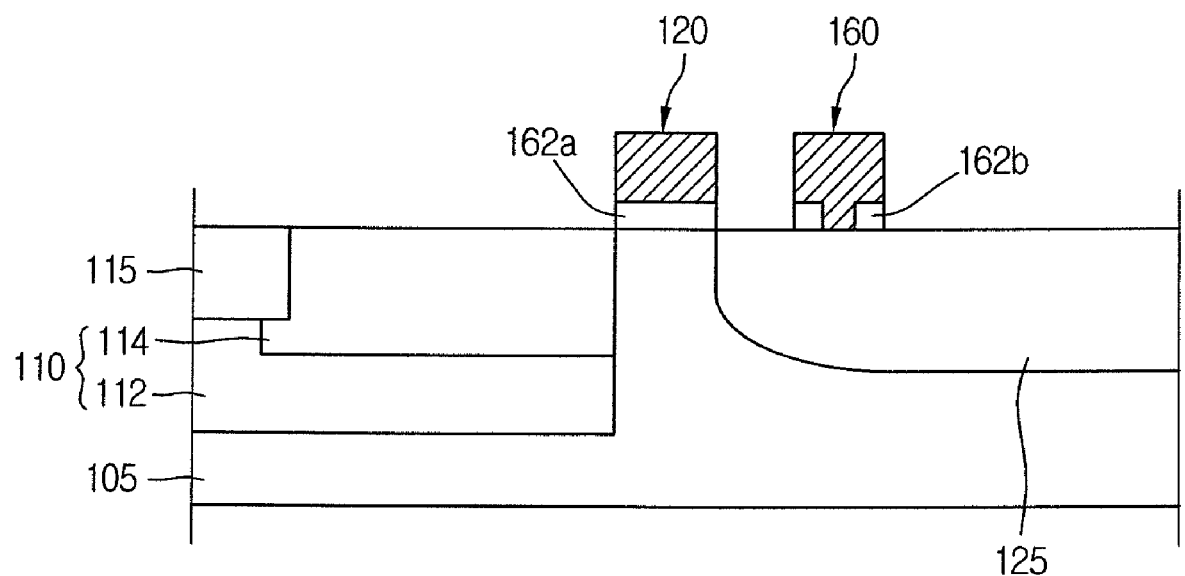

Example FIGS. 3A to 3C illustrate cross-sectional views of a process of manufacturing an image sensor, according to embodiments.

Figure 4A:
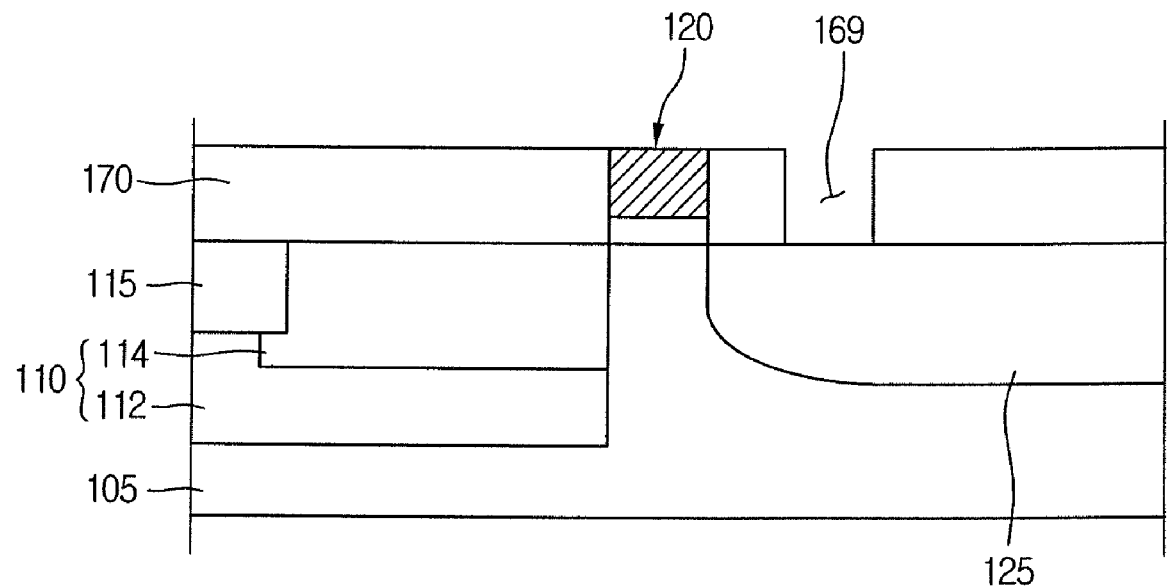
Figure 4B:
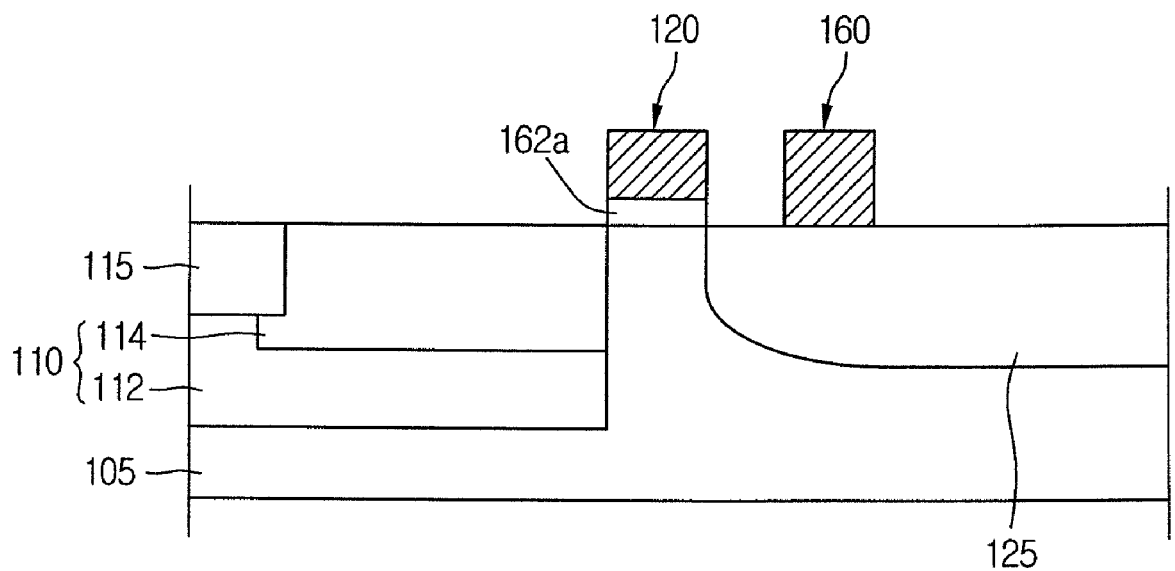

Example FIGS. 4A to 4B illustrate cross-sectional views of a process of manufacturing an image sensor, according to embodiments.

DESCRIPTION

Embodiments relate to an image sensor and a method of manufacturing an image sensor. In the description of the embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Example FIG. 1 illustrates a plane view of an image sensor, in accordance with embodiments. Although illustrated embodiments show a CIS image sensor having four transistors, embodiments are not limited to a CIS image sensor having four transistors. One of ordinary skill in the art would appreciate that other numbers of transistors may be implemented. An image sensor may include a first unit pixel 100, a second unit pixel 200, and a contact 160, in accordance with embodiments. Contact 160 may electrically connect first unit pixel 100 with second unit pixel 200. First unit pixel 100 may be a main pixel and second unit pixel 200 may be a dummy pixel.

First unit pixel 100 may include one photodiode 110 and four transistors 120, 130, 140 and 150, in accordance with embodiments. For example, first unit pixel 100 may include a first transfer transistor 120, a first reset transistor 130, a first drive transistor 140, and a first select transistor 150. In embodiments a first load transistor may be formed outside of the first unit pixel, which may read an output signal.

Second unit pixel 200 may include one photodiode 210 and four transistors 220, 230, 240 and 250. For example, the second unit pixel 200 may include a second transfer transistor 220, a second reset transistor 230, a second drive transistor 240, and a second select transistor 250.

Embodiments may include contact 160 electrically connecting a floating diffusion region 125 of the first unit pixel 100 with the second drive transistor 240 of the second unit pixel 200. Contact 160 may have contact with a side wall of second drive transistor 240. Contact 160 may have contact with the top side of second drive transistor 240. Contact 160 may contact both a side wall and top side of second drive transistor 240, in accordance with embodiments.

Embodiments relate to an image sensor and/or a method of manufacturing an image sensor having an increased aspect ratio by forming a contact that electrically connects a floating diffusion region of the first unit pixel with the second drive transistor of the second unit pixel. Embodiments relate to an image sensor and/or a method for manufacturing an image sensor having a relatively large process margin (e.g. even in a high level pixel), which may reduce restrictions when downscaling an image sensor. In embodiments, a contact electrically connects a floating diffusion region of a first unit pixel with a second drive transistor of a second unit pixel. Circuitry may be formed to recognize the electrical signal and/or the power signal transferred to the second drive transistor of the second unit pixel as an electrical signal and/or a power signal of the first unit pixel, in accordance with embodiments.

Example FIG. 2A is a cross-sectional view of an image sensor along the AA' line of FIG. 1, in accordance with embodiments. In embodiments, an image sensor may include under insulator 162b formed between the bottom of contact 160 and substrate 105 in the first unit pixel 100. Under insulator 162b may prevent an attack and/or defect on substrate 105 during etching (e.g. during formation of contact 160), in accordance with embodiments. Under insulator 162b may prevent dark current by precluding a leakage current, in accordance with embodiments.

Example FIGS. 3A to 3C are cross-sectional views illustrating a manufacturing process of an image sensor, according to embodiments. Contact 160 may be formed at the same time as forming first unit pixel 100 and/or forming the second unit pixel 200. As illustrated in example FIG. 3A, first photodiode 110 and first transfer transistor 120 may be formed, in accordance with embodiments. For example, first photodiode 110 may be formed including a PN photodiode after isolation layer 115 is formed. As illustrated in example FIG. 3A, a P type Epi layer 112 may be formed on a P+ type substrate 105, in accordance with embodiments. N− region 114 may be formed in P type Epi layer 112. The first floating diffusion region 125 may be a N+ type doping region.

First insulator 162 may be formed over first unit pixel 100 region and second unit pixel 200 region. First insulator 162 may include an oxide, nitride, and/or other similar material. For example, first insulator 162 may be formed by oxidizing substrate 105. First photoresist pattern 310 may be formed by selectively exposing first insulator 162 over first floating diffusing region 125 of first unit pixel 100. First contact hole 166 may be formed by selectively removing first insulator 162 over floating diffusing region 125 of first unit pixel region 100. First contact hole 166 may have a smaller horizontal width than the gate of first transfer transistor 120. In embodiments, contact 160 may include under insulator 162b, which is formed between the bottom of contact 160 and substrate 105 of first unit pixel 100. In embodiments, if first contact hole 166 has a same horizontal width as the gate of first transfer transistor 120, there may be no under insulator.

As illustrated in example FIG. 3B, polysilicon layer 164 may be formed on and/or over first contact hole 166 and/or first insulator 162 after first photoresist pattern 310 removed, in accordance with embodiments. Second photoresist pattern 320 may be formed on and/or over polysilicon layer 164 to selectively expose polysilicon layer 164 in both the transistor region and the contact region in both first unit pixel region 100 and second unit pixel region 200.

As illustrated in example FIG. 3C, the gate of first transfer transistor 120, the gate of second drive transistor 240, and/or contact 160 may be formed at substantially the same time by selectively etching the exposed polysilicon layer 164 and first insulator 162 using second photoresist pattern 320 as an etch mask. Gate insulator 162a and under insulator 162b may be formed by selectively etching first insulator 162. In embodiments, contact 160 may be formed to electrically connect with a second drive transistor by filling first contact hole 166.

In embodiments, under insulator 162b may prevent an attack and/or defect to substrate 105 during etching (e.g. during forming of contact 160). In embodiments, under insulator 162b may prevent dark current by precluding a leakage current. Embodiments relate to an image sensor and/or a method of manufacturing an image sensor that has an increased aspect ratio due to formation of a contact electrically connecting a floating diffusion region of a first unit pixel with a second drive transistor of a second unit pixel. Embodiments relate to an image sensor and/or a method of manufacturing an image sensor having a relatively high process margin (e.g. even in a high level pixel). In accordance with embodiments, a relatively high process margin may minimize and/or substantially eliminate restrictions in downscaling an image sensor.

Example FIG. 2B is a cross-sectional view of an image sensor along the AA' line of FIG. 1, in accordance with embodiments. In embodiments (e.g. embodiments illustrated in FIG. 2B), there is no under insulator. Aspects of embodiments illustrated in example FIG. 2B are similar to embodiments illustrated in example FIG. 2A.

Example FIGS. 4A to 4B are cross-sectional views of a manufacturing process of an image sensor, in accordance with embodiments. In embodiments, contact 160 may be formed after forming both first unit pixel 100 and second unit pixel 200. As illustrated in FIG. 4A, an inter-metal dielectric 170 can be formed over the first unit pixel 100 and the second unit pixel 200. Second contact hole 169 may be formed by selectively removing inter metal dielectric 170 on and/or over floating diffusion region 125 of first unit pixel 100. In embodiments, contact 160 electrically connecting second drive transistor 240 may be formed by filling second contact hole 169. Inter metal dielectric 170 may be removed in embodiments. In embodiments, inter metal dielectric 170 may not be removed.

Embodiments relate to an image sensor and/or a method of manufacturing an image sensor that may have an increased aspect ratio by forming a contact that electrically connects a floating diffusion region of a first unit pixel with a second drive transistor of a second unit pixel. In embodiments, an image sensor may be formed having a relatively large process margin (e.g. even in high level pixel), which may minimize and/or substantially eliminate restrictions in downscaling an image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a first unit pixel including a first transfer transistor;
    forming a second unit pixel including a second drive transistor; and
    forming a contact that electrically connects a floating diffusion region of the first unit pixel with the second drive transistor of the second unit pixel,
    wherein said forming the contact comprises:

forming a first insulator over a first unit pixel region and a second unit pixel region;

forming a first contact hole by selectively removing the first insulator over a floating region of the first pixel region;

forming a contact that electrically connects the second drive transistor by filing the first contact hole, wherein the contact comprises under insulators between the bottom of the contact and a substrate on which the first unit pixel is formed, wherein a width of the first contact hole is smaller than a width of a top side of the contact, and wherein an outer distance between the under insulators is same as the width of the top side of the contact.

2. The method according to claim 1, wherein said forming the contact is processed at the same time as said forming the first unit pixel and said forming the second unit pixel.

3. The method according to claim 1, wherein said forming the contact comprises:

forming a polysilicon layer on the first contact hole and the first insulator;

forming a second photoresist pattern on the polysilicon layer that selectively exposes the polysilicon layer of both a transistor region and a contact region;

forming a gate of the first transfer transistor, a gate of the second drive transistor and the contact at the same time by selectively etching the exposed polysilicon layer and the first insulator using the second photoresist pattern as an etch mask.

4. The method according to claim 3, wherein the contact hole has a smaller horizontal width than a gate of the first transfer transistor.

5. The method according to claim 3, wherein the contact hole has substantially the same horizontal width as a gate of the first transfer transistor.

6. The method according to claim 1, wherein the contact comprises polysilicon.

7. The method according to claim 1, wherein the first unit pixel is a main pixel and the second unit pixel is a dummy pixel.

8. The method according to claim 1, wherein the contact is formed contacted with side wall of the second drive transistor.

9. The method according to claim 1, wherein said forming the contact is processed after said forming the first unit pixel and said forming the second unit pixel.

10. The method according to claim 9, wherein said forming the contact comprises:

forming a inter metal dielectric over the first unit pixel and the second unit pixel;

forming a second contact hole by selectively removing the inter metal dielectric over a floating region of the first pixel; and forming a contact that electrically connects a second drive transistor by filling the second contact hole.

* * * * *